United States Patent [19]

Wu

[11] Patent Number: 5,726,086
[45] Date of Patent: Mar. 10, 1998

[54] METHOD OF MAKING SELF-ALIGNED CYLINDRICAL CAPACITOR STRUCTURE OF STACK DRAMS

[75] Inventor: Chung-Cheng Wu, I-Lan, Taiwan

[73] Assignee: Mosel Vitelic Inc., Hsinchu, Taiwan

[21] Appl. No.: 746,842

[22] Filed: Nov. 18, 1996

[51] Int. Cl.$^6$ ............................................. H01L 21/8242
[52] U.S. Cl. ................................. 438/253; 438/240
[58] Field of Search ............................ 438/240, 253, 438/396, 637, 702

[56] References Cited

U.S. PATENT DOCUMENTS

| | | | |
|---|---|---|---|
| 5,185,282 | 2/1993 | Lee et al. | 438/253 |
| 5,273,925 | 12/1993 | Yamanaka | 438/396 |
| 5,364,809 | 11/1994 | Kwon et al. | 438/240 |
| 5,468,670 | 11/1995 | Ryou | 438/253 |

*Primary Examiner*—Chandra Chaudhari
*Attorney, Agent, or Firm*—Bacon & Thomas

[57] ABSTRACT

The present invention discloses a method of fabricating self-aligned cylindrical capacitor in stack Dynamic Random Access Memory (Stack DRAM) cells. The polysilicon stud is filled in the contact window of the source region of a metal-oxide-semiconductor field effect transistor (MOSFET). Then the polysilicon spacers are formed on the sidewalls of the first polysilicon stud. The cylindrical capacitor storage node of the DRAM capacitor of the present invention has much greater surface area so as to increase the capacitance value of the DRAM capacitor, that can achieve high packing density of the integrated circuit devices. Furthermore, this new process only needs one lithography photomask to open contact window compared with the conventional process which needs two lithography photomasks, that further reduces the production cost.

21 Claims, 4 Drawing Sheets

METHOD OF MAKING SELF-ALIGNED CYLINDRICAL CAPACITOR STRUCTURE OF STACK DRAMS

BACKGROUND OF THE INVENTION

1. Field of the invention

The present invention relates to a method of fabricating the capacitors in dynamic random access memory (DRAM) cells, and more particularly to the self-aligned cylindrical capacitor structure of stack DRAMs.

2. Description of the related art

A DRAM cell comprises a metal-oxide-semiconductor field effect transistor (MOSFET) and capacitors which are built in a semiconductor silicon substrate. There is an electrical contact between the source of a MOSFET and the storage node of the adjacent capacitor, forming a memory cell of the DRAM device. A large number of memory cells make up the cell arrays which combine with the peripheral circuit to produce stack DRAMs.

In recent years, the sizes of the MOSFETs and capacitors have become continuously smaller so that the packing densities of these DRAM devices have increased considerable. For example, a number of semiconductor manufacturing companies in the world have already begun mass production of 16M bit or even 64M bit DRAMs. As the sizes of the capacitors become smaller, so as the capacitance values of the capacitors are decreasing, that reduces the signal to noise ratio of the DRAM circuits, causing the performance problem. In order to maintain or even increase the value of the capacitance for smaller size capacitors, increasing the surface area of the polysilicon storage nodes or reducing the thickness of the dielectric layer is necessary.

Various shapes of capacitor structures have been used to address this issue. U.S. Pat. No. 5,185,282 to Lee et al. (the entire disclosure of which is herein incorporated by reference) provide a method of fabricating cup-shaped capacitor storage node. Another U.S. Pat. No. 5,273,925 to Yamanaka (the entire disclosure of which is herein incorporated by reference) provide a method of fabricating cylindrical capacitor electrode. These capacitor structures can effectively increase the capacitance values of the capacitors, but the processes are too complicated to be practically employed for mass-production.

The present invention discloses a new method to fabricate high-capacitance cylindrical capacitors of stack DRAMs which only need a lithographic photomask, which can reduce the manufacturing steps compared with that of conventional stack capacitors which need two photomasks, therefore it can increase the production line outputs and cut down the cost.

SUMMARY OF THE INVENTION

According, it is a primary object of the present invention to provide a method for a DRAM cell with greater capacitance per unit area.

It is another object of the present invention to provide a method which can reduce the production cost of manufacturing DRAMs.

These objects are accomplished by the fabrication process described below.

First, a field oxide layer for isolation is grown on the semiconductor silicon substrate by standard integrated circuit fabrication process. Then, a MOSFET which includes gate oxide, gate electrode and source/drain regions are formed on the semiconductor silicon substrate.

Next, the first dielectric, second dielectric and third dielectric layers are continuously deposited. The first, second and third dielectric layers are etched by plasma-etching to expose the source region of the MOSFET in order to form a cell contact window of the DRAM cell.

Then, the first polysilicon layer which is overlaying the third dielectric layer and the cell contact is formed.

The first polysilicon layer is then anisotropic etchback by plasma-etching technique to form the first polysilicon stud.

Next, the third dielectric layer is removed to expose the second dielectric layer and the top part of the first polysilicon stud. Then, the second polysilicon and the fourth dielectric layers are formed. The fourth dielectric layer is then vertically anisotropically etched to form the fourth dielectric spacers on the sidewalls of the first polysilicon stud.

Next, the third polysilicon layer is deposited, then, partially etched to remove the third polysilicon layer overlaying the third dielectric layer and the remaining second polysilicon layer in order to form the third polysilicon spacers just beside the fourth dielectric spacers.

Finally, the fourth dielectric spacers are removed. The capacitor storage node structure consists of the first polysilicon stud, second polysilicon layer and third polysilicon spacers is then accomplished.

Since the capacitor storage node of a DRAM cell of the present invention is cylindrical shape, it can increase the surface area of the capacitor, and also increase the capacitance value of the DRAM capacitor, that provides a method to achieve high packing density of the integrated circuits. Besides, this new process only needs a lithographic photomask, which further reduces the production expense.

After the storage node of the DRAM capacitor is completed, the dielectric layer and the top plate of the capacitor are formed by standard integrated circuit technologies. Therefore, a self-aligned cylindrical capacitor structure of stack DRAMs is finally accomplished.

BRIEF DESCRIPTION OF THE INVENTION

The accompanying drawings forming a material part of this description, in which.

3

Figure 9:
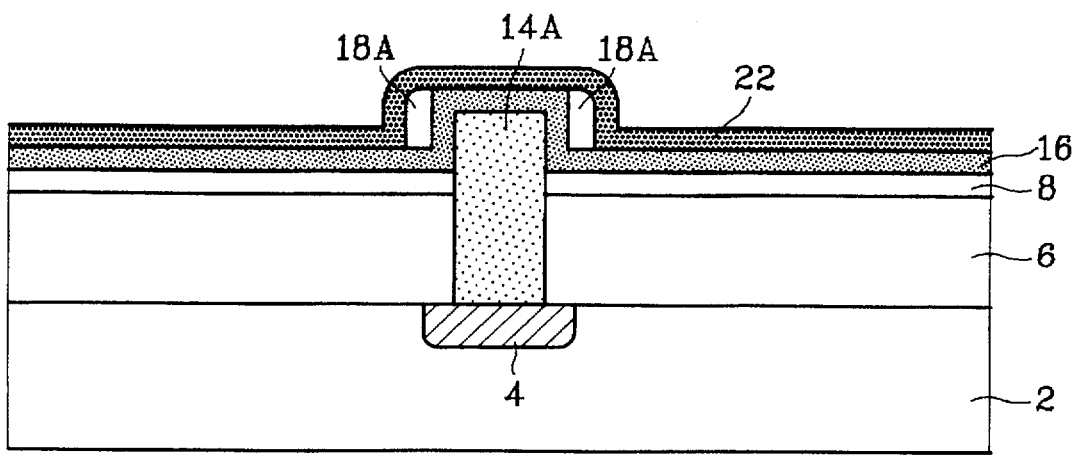
FIG. 9 is a cross sectional representation of the circuit of FIG. 8 after the third polysilicon layer is deposited.
Figure 10:
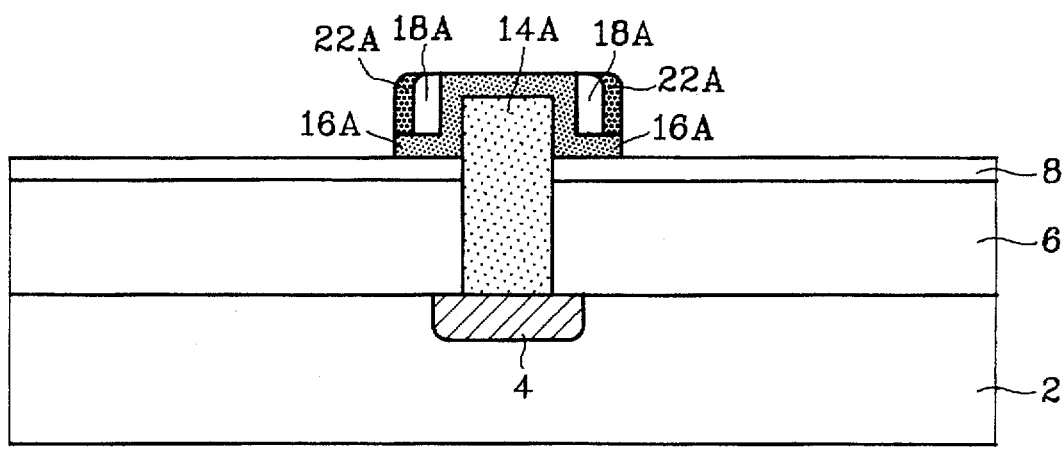

FIG. 10 is a cross sectional representation of the circuit of FIG. 9 after the third polysilicon layer is anisotropically etched to form the third polysilicon spacers just beside the fourth dielectric spacers.

Figure 11:
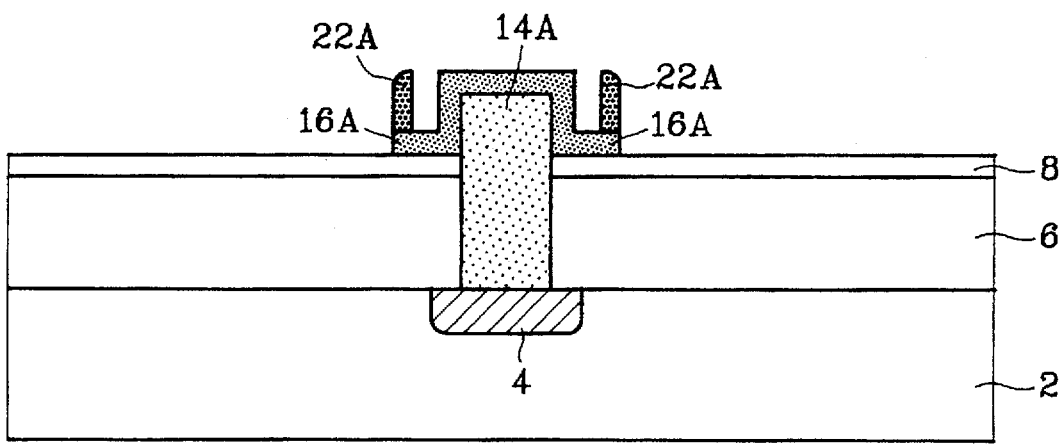

FIG. 11 is a cross sectional representation of the circuit of FIG. 10 after the fourth dielectric spacers are removed to complete the cylindrical capacitor storage node formation.

DESCRIPTION OF THE PREFERRED EMBODIMENT

The invention discloses herein is directed to a method of fabricating the capacitor storage nodes of DRAMs. The drawing figures are illustrated a partially completed integrated circuit device. In the following description, numerous details are set forth in order to provide a thorough understanding of the present invention. It will be appreciated by one skilled in the art that variations of these specific details are while still achieving the results of the present invention. In other instance, well-known processing steps are not described in detail in order not unnecessarily to obscure the present invention.

Figure 1:
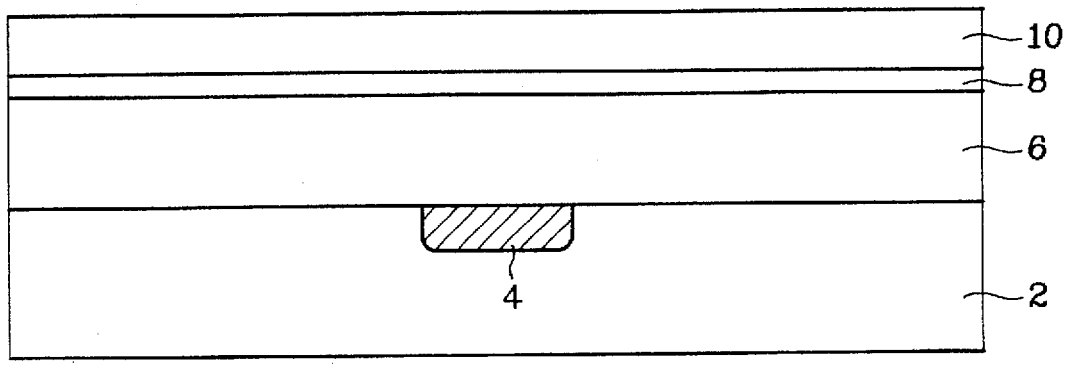
FIG. 1 is a cross sectional representation of integrated circuit after the source of the MOSFET and the first, second, third dielectric layers are finished.

Referring now more particularly to FIG. 1, there is shown a portion of partially completed Metal-Oxide-Semiconductor Field Effect Transistor (MOSFET). A MOSFET region is usually consist of a gate oxide, gate electrode, pad oxide, lightly doped region, spacers, source and drain. For simplicity reason, FIG. 1 only shows the source region of a MOSFET which is fabricated on a semiconductor silicon substrate 2. The source region 4 of the MOSFET which is formed by ion implantation technique, is preferably doped with arsenic ($As^{75}$) or phosphorus ($P^{31}$) ions, with an implantation dose of 1E14 to 5E16 $cm^{-2}$, and an implantation energy of 30 to 80 keV.

Referring to FIG. 1 again, the first 6, second 8 and third 10 dielectric layers are continuously deposited on the silicon substrate 2. The first dielectric layer 6 is usually using borophosphosilicate glass (BPSG) or undoped silicate glass (NSG) which is formed by atmosphere pressure chemical vapor deposition (APCVD) technique. The APCVD processing is operated under the following conditions: the temperature is about 400° C., and pressure is about 1.0 torr, with reactant gases of $Si(C_2H_5O)_4$, TMB (Tri-Methyl-Borate) and $N_2$ flowing. The thickness of the first dielectric layer 6 is about 3000 to 8000 Angstroms. Thereafter, the fist dielectric layer 6 is planerized by either thermal flow etchback or chemical mechanical polishing (CMP) methods. The second dielectric layer 8 is usually using silicon nitride which is formed by low pressure CVD (LPCVD) technique under the following condition: the temperature is about 760° C., and pressure is about 0.3 torr, with reactant gases of $NH_3$ and $SiH_4$. The thickness of the second dielectric layer 8 is about 100 to 1500 Angstroms. The third dielectric layer 10 is usually using silicon dioxide which is formed by LPCVD technique under the following conditions: the temperature is about 720° C., the pressure is about 0.25 torr, with mixture gasses of $Si(C_2H_5O)_4$, $N_2O$ and $O_2$. The thickness of the third dielectric layer 10 is about 1000 to 8000 Angstroms.

Figure 2:
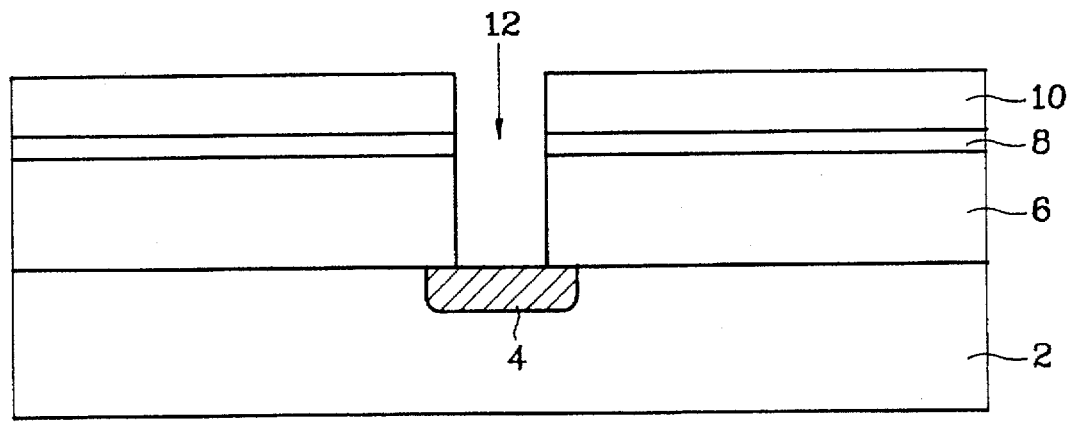
FIG. 2 is a cross sectional representation of the circuit of FIG. 1 after the cell contact window of the MOSFET is formed.

Referring now to FIG. 2, the first, second, and third dielectric layers are partially etched to open a cell contact window 12 for the source 4 of the MOSFET by conventional lithography and plasma-etching techniques. The plasma etching process can use magnetic enhanced reactive ion etching (MERIE), electron cyclotron etching (ECR) or reactive ion etching (RIE) methods with reactant gases such as $CF_4$, $CHF_3$ and Ar.

Figure 3:
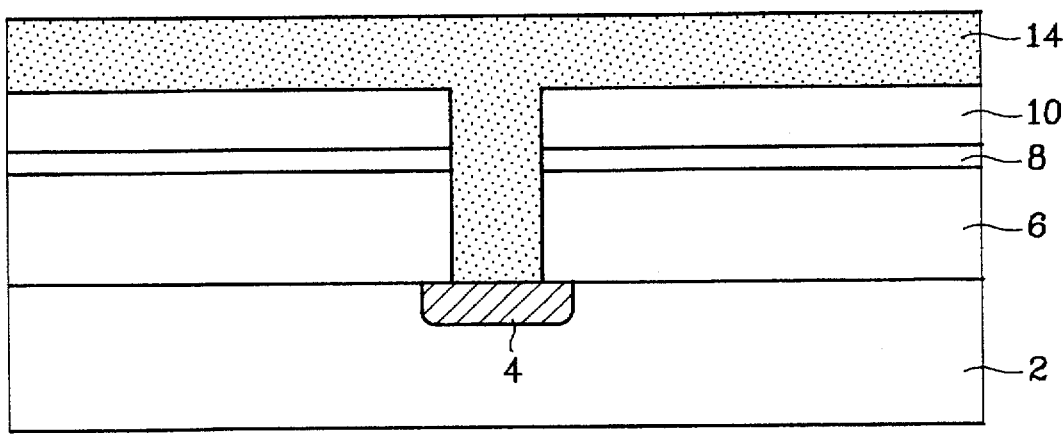
FIG. 3 is a cross sectional representation of the circuit of FIG. 2 after the first polysilicon layer is deposited.

Referring now to FIG. 3, the first polysilicon layer 14 which is overlaying the third dielectric layer and filling in the cell contact window 12 is deposited. The first polysilicon layer 14 is usually formed by in-situ phosphorus doped LPCVD method under a mixture of (15% $PH_3$+85% $SiH_4$) and (5% $PH_3$+95% $N_2$), at the temperature about 550° C. to obtain a thickness of between 1000 to 4000 Angstroms.

Figure 4:
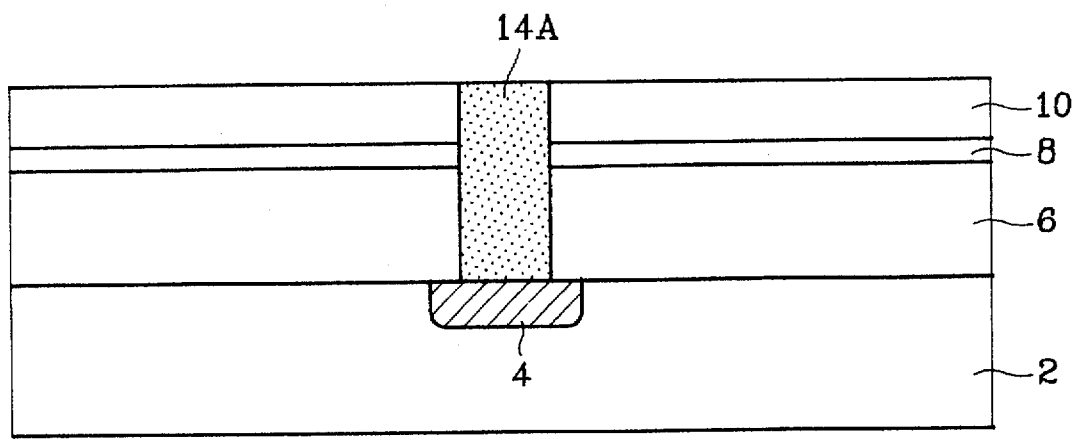
FIG. 4 is a cross sectional representation of the circuit of FIG. 3 after the portions first polysilicon layer which is overlaying the third dielectric layer is removed to form the first polysilicon stud.

Referring now to FIG. 4, the top portion of the polysilicon layer which is overlaying the third dielectric layer 10 is then anisotropically etched by plasma-etching technique to form the polysilicon stud 14A in cell contact window. The polysilicon plasma-etching process can also use MERIE, ECR or RIE methods with reactant gases such as $Cl_2$, $SF_6$ and HBr.

Figure 5:
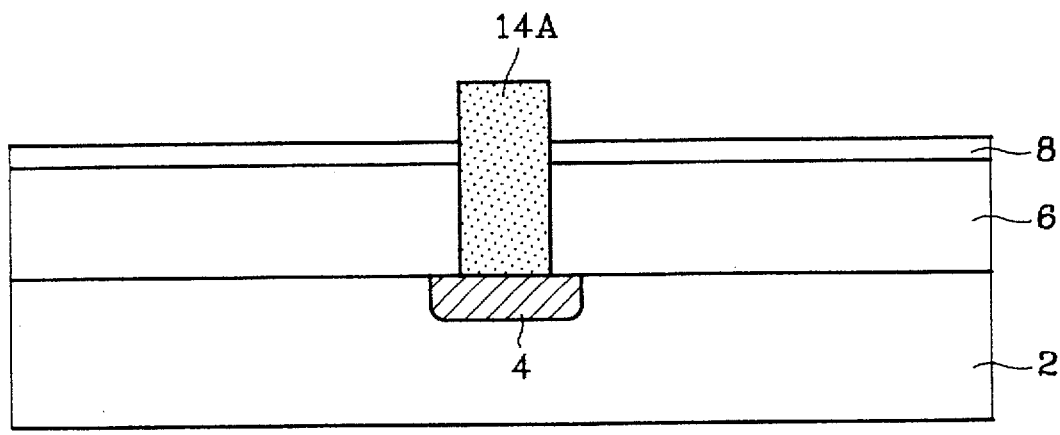
FIG. 5 is a cross sectional representation of the circuit of FIG. 4 after the third dielectric layer is etched away.

Referring now to FIG. 5, the third dielectric layer 10 is removed by dipping into hydrofluoric (HF) acid to expose the second dielectric layer 8 and top part of first polysilicon stud 14A as shown in FIG. 5.

Figure 6:
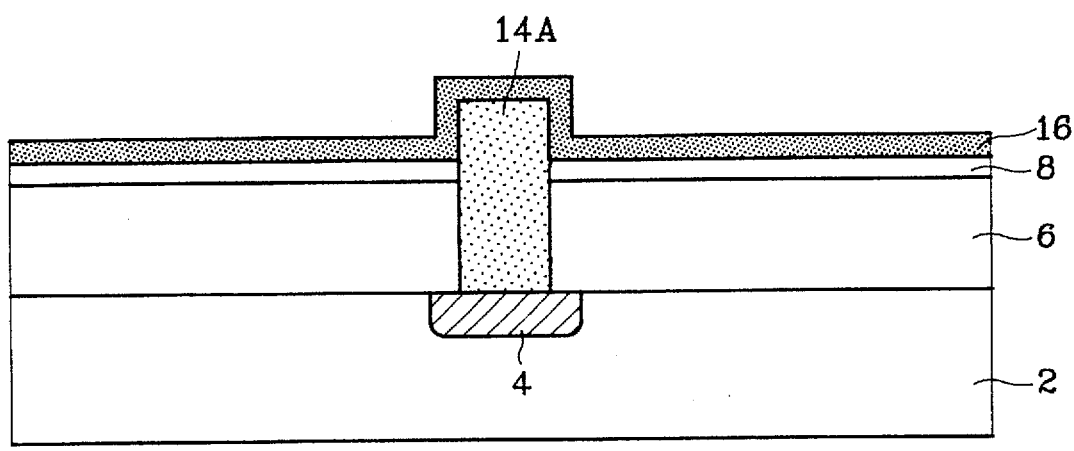
FIG. 6 is a cross sectional representation of the circuit of FIG. 5 after the second polysilicon layer is grown.

Referring now to FIG. 6, the second polysilicon layer 16 is deposited overlaying the structure of FIG. 5. The second polysilicon layer 16 is also formed by in-situ phosphorus doped LPCVD method under a mixture of (15% $PH_3$+85% $SiH_4$) and (5% $PH_3$+95% $N_2$), at the temperature about 550° C. But the thickness of second polysilicon layer 16 is only about 500 to 2000 Angstroms.

Figure 7:
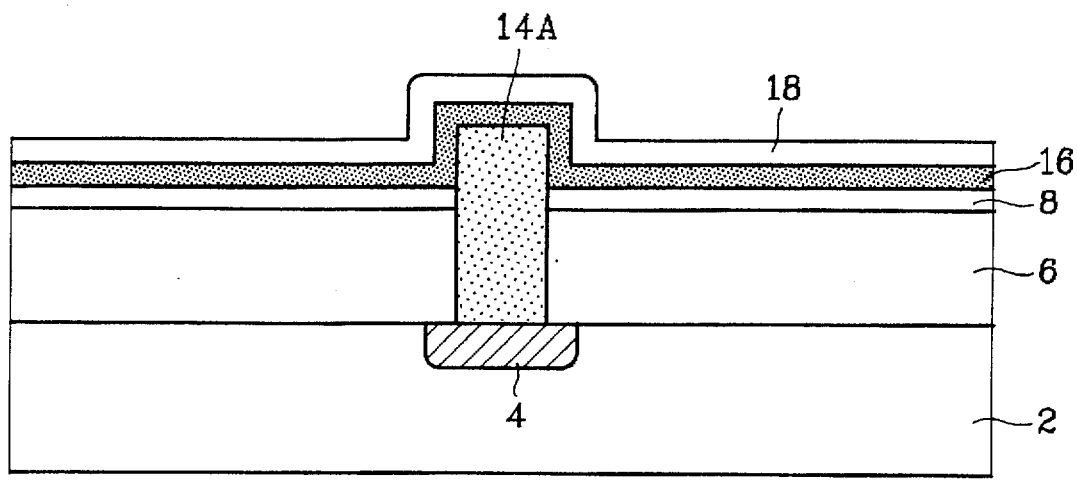
FIG. 7 is a cross sectional representation of the circuit of FIG. 6 after the fourth dielectric layer is formed.

Referring now to FIG. 7, the fourth dielectric layer 18 is deposited overlaying the second polysilicon layer 16. The fourth dielectric layer 18 is usually using silicon dioxide which is formed by LPCVD technique under the same conditions as the third dielectric layer 10. The thickness of the fourth dielectric layer 18 is about 800 to 2400 Angstroms.

Figure 8:
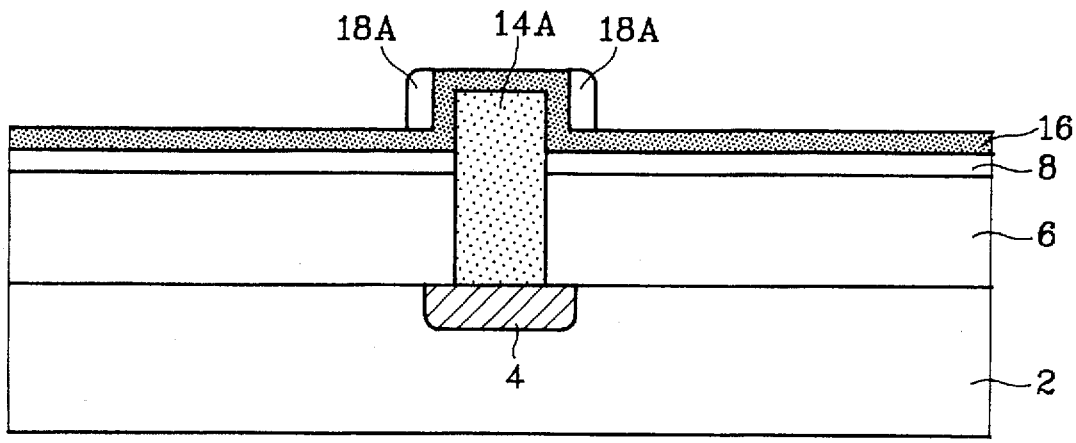
FIG. 8 is a cross sectional representation of the circuit of FIG. 7 after the fourth dielectric layer is anisotropically etched to form fourth dielectric spacers on the sidewalls of the first polysilicon stud.

Referring now to FIG. 8, the fourth dielectric layer is then anisotropically etched to form the fourth dielectric spacers 18A which are located on the sidewalls of the first polysilicon stud 14. The plasma-etching process for the fourth dielectric layer can still use MERIE, ECR or RIE methods with reactant gases such as $CF_4$, $CHF_3$ and Ar.

Referring now to FIG. 9, the third polysilicon layer 22 is deposited overlaying the structure of FIG. 8. The third polysilicon layer 22 is formed by the same method as second polysilicon layer 16 which is described before. The thickness of the third polysilicon layer is about 1000 to 2000 Angstroms.

Referring now to FIG. 10, the second and third polysilicon layers are vertically anisotropically etched thereby leaving the third polysilicon spacers 22A and the second polysilicon layer 16A underneath on the sildewalls of the first polysilicon stud 14A. The plasma-etching process for the second and third polysilicon layers is again using the MERLE, ECR or RIE methods with reactant gases such as $Cl_2$, $SF_6$ and HBr.

Referring now to FIG. 11, finally, the fourth dielectric spacers 18A are removed by hydrofluoric acid solution or vapor, and is preferable using hydrofluoric vapor which is more effective. The storage node of the DRAM capacitor which is consist of the remaining first polysilicon stud 14A, the second polysilicon 16A and the third polysilicon spacers is finally completed as shown in FIG. 11.

The cylindrical capacitor storage node of the present invention has much greater surface area so as to increase the capacitance value of the DRAM capacitor, that can achieve high packing density of the integrated circuit devices. Besides, this new process only needs a lithography photomask to open cell contact window, which further reduces the production cost.

After the formation of capacitor storage node is finished, the dielectric layer and top plate of the capacitor (not shown in the Figures) are then formed by standard integrated circuit processing procedure. A self-aligned cylindrical capacitor structure of stack DRAMs is accomplished. The capacitor dielectric layer is usually using nitride/oxide (NO) doublelayer or oxide/nitride/oxide (ONO) triplelayer or even tantalum oxide ($Ta_2O_5$) material. The thickness of the capacitor dielectric layer is about 20 to 100 Angstroms. The top plate of the capacitor which is utilizing polysilicon has a thickness of about 1000 to 2000 Angstroms.

While the invention has been particularly shown and described with reference to a preferred embodiment, it will be understood by those skilled in the art that various changes in form and detail may be made therein without departing from the spirit and scope of the present invention.

What we claimed is:

1. A method of fabricating the capacitors of a DRAM cell, said method comprising the step of:
   (a) forming MOSFET structures on a silicon substrate, wherein said MOSFET comprises of gate oxide, gate electrode and drain/source regions;
   (b) continuously forming the first, second, and third dielectric layers overlaying the surface of said silicon substrate;
   (c) etching said first, second, and third dielectric layer to open a cell contact window for said source region of said MOSFET by conventional lithography and plasma-etching techniques;
   (d) forming the first polysilicon layer overlaying said third dielectric layer and filling in said cell contact window;
   (e) anisotropically etching said first polysilicon layer to form the first polysilicon stud therein said cell contact window;
   (f) removing said third dielectric layer to expose said second dielectric layer and said first polysilicon stud;
   (g) forming the second polysilicon layer overlaying said second dielectric layer and said first polysilicon stud;
   (h) forming the fourth dielectric layer overlaying overlaying said second polysilicon layer;
   (i) anisotropically etching said fourth dielectric layer to form the fourth dielectric spacers on the sidewalls of said first polysilicon stud;
   (j) forming the third polysilicon layer overlayilng said second dielectric layer, remaining of said second polysilicon layer and said fourth dielectric spacers;
   (k) vertically anisotropically etching said second and third polysilicon layers thereby leaving the third polysilicon spacers and said second polysilicon layer underneath on the sidewalls of said first polysilicon stud;
   (l) removing said fourth dielectric spacers, the storage node of said capacitor which is consist of the remaining said first polysilicon stud, said second polysilicon layer, and said third polysilicon spacers is constructed;
   (m) forming the capacitor dielectric layer and top plate of said capacitor by standard integrated circuit processing procedure.

2. The method of claim 1, wherein said first dielectric layer is made of borophosphosilicate glass (BPSG) or undoped silicate glass (USG) which has a thickness of 3000 to 8000 Angstroms.

3. The method of claim 1, wherein said second dielectric layer is formed with low chemical vapor deposition (LPCVD) nitride, which has a thickness of 100 to 1500 Angstroms.

4. The method of claim 1, wherein said third dielectric layer is formed with silicon dioxide ($SiO_2$), which has a thickness of 1000 to 8000 Angstroms.

5. The method of claim 1, wherein said fourth dielectric layer is formed with silicon dioxide ($SiO_2$), which has a thickness of 800 to 2400 Angstroms.

6. The method of claim 1, wherein said first polysilicon layer is formed which has a thickness of 1000 to 4000 Angstroms by LPCVD technique.

7. The method of claim 1, wherein said second polysilicon layer which has a thickness of 500 to 2000 Angstroms, is formed by LPCVD technique.

8. The method of claim 1, wherein said third polysilicon layer which has a thickness of 1000 to 2000 Angstroms, is formed by LPCVD technique.

9. The method of claim 1, wherein said capacitor dielectric layer is made of nitride/oxide (NO) doublelayer or oxide/nitride/oxide (ONO) triplelayer or tantalum oxide ($Ta_2O_5$), which has a thickness of 20 to 100 Angstroms.

10. The method of claim 1, wherein said top plate of the capacitor which is formed with polysilicon, has a thickness of 1000 to 2000 Angstroms.

11. The method of claim 1, wherein said storage node of the capacitor is the same conduction type (N type or P type) as said source/drain regions of a MOSFET.

12. A method of forming polysilicon capacitor structure, said method comprising the steps of:
    (a) continuously forming the first, second, and third dielectric layers overlaying the surface of said silicon substrate;
    (b) etching said first, second, and third dielectric layer to open a cell contact window for said source region of said MOSFET by conventional lithography and plasma-etching techniques;
    (c) forming the first polysilicon layer overlaying said third dielectric layer and filling in said cell contact window;
    (d) anisotropically etching said first polysilicon layer to form the first polysilicon stud therein said cell contact window;
    (e) removing said third dielectric layer to expose said second dielectric layer and said first polysilicon stud;
    (f) forming the second polysilicon layer overlaying said second dielectric layer and said first polysilicon stud;
    (g) forming the fourth dielectric layer overlaying overlaying said second polysilicon layer;
    (h) anisotropically etching said fourth dielectric layer to form the fourth dielectric spacers on the sidewalls of said first polysilicon stud;
    (i) forming the third polysilicon layer overlayilng said second dielectric layer, remaining of said second polysilicon layer and said fourth dielectric spacers;
    (j) vertically anisotropically etching said second and third polysilicon layers thereby leaving the third polysilicon spacers and said second polysilicon layer underneath on the sidewalls of said first polysilicon stud;
    (k) removing said fourth dielectric spacers, the storage node of said capacitor which is consist of the remaining said first polysilicon stud, said second polysilicon layer, and said third polysilicon spacers is constructed;
    (l) forming the capacitor dielectric layer and top plate of said capacitor by standard integrated circuit processing procedure.

13. The method of claim 12, wherein said first dielectric layer is made of borophosphosilicate glass (BPSG) or undoped silicate glass (USG) which has a thickness of 3000 to 8000 Angstroms.

14. The method of claim 12, wherein said second dielectric layer is formed with low chemical vapor deposition (LPCVD) nitride, which has a thickness of 100 to 1500 Angstroms.

15. The method of claim 12, wherein said third dielectric layer is formed with silicon dioxide ($SiO_2$), which has a thickness of 1000 to 8000 Angstroms.

16. The method of claim 12, wherein said fourth dielectric layer is formed with silicon dioxide ($SiO_2$), which has a thickness of 800 to 2400 Angstroms.

17. The method of claim 12, wherein said first polysilicon layer which has a thickness of 1000 to 4000 Angstroms is formed by LPCVD technique.

18. The method of claim 12, wherein said second polysilicon layer which has a thickness of 500 to 2000 Angstroms, is formed by LPCVD technique.

19. The method of claim 12, wherein said third polysilicon layer which has a thickness of 1000 to 2000 Angstroms, is formed by LPCVD technique.

20. The method of claim 12, wherein said capacitor dielectric layer which is made of nitride/oxide (NO) doublelayer or oxide/nitride/oxide (ONO) triplelayer or tantalum oxide ($Ta_2O_5$), has a thickness of 20 to 100 Angstroms.

21. The method of claim 12, wherein said top plate of the capacitor which is formed with polysilicon, has a thickness of 1000 to 2000 Angstroms.

* * * * *